US006202044B1

United States Patent
Tzori (10) Patent No.: US 6,202,044 B1
(45) Date of Patent: Mar. 13, 2001

(54) CONCURRENT HARDWARE-SOFTWARE CO-SIMULATION

(75) Inventor: Yiftach Tzori, Sunnyvale, CA (US)

(73) Assignee: Simpod, Inc,, Santa Clara, CA (US)

( * ) Notice: Subject to any disclaimer, the term of this patent is extended or adjusted under 35 U.S.C. 154(b) by 0 days.

(21) Appl. No.: 09/096,672

(22) Filed: Jun. 12, 1998

Related U.S. Application Data (60) Provisional application No. 60/050,059, filed on Jun. 13, 1997.

(51) Int. Cl.[7] .................................................. G06F 9/455
(52) U.S. Cl. ................................ 703/28; 703/14; 714/25; 714/28
(58) Field of Search .................... 395/500.44, 500.45, 395/500.46, 500.47, 500.48, 500.49; 714/25, 28, 29; 703/28, 24, 23, 14

(56) References Cited

U.S. PATENT DOCUMENTS

| | | | |
|---|---|---|---|
| 4,590,581 | * 5/1986 | Widdoes, Jr. | 364/578 |
| 4,635,218 | * 1/1987 | Widdoes, Jr. | 364/578 |

(List continued on next page.)

OTHER PUBLICATIONS

Wieler et al., "Using an FPGA Based Computer as a Hardware Emulator for Built–in Self Test Structures", Proc. 5th Inter. Workshop of Rapid System Prototyping, pp. 16–21, Jun. 1994.*

Kumar et al., "Emulation Verification of the Motorola 68060", Proc. 1995 IEEE Inter. Conf. on Computer Design, pp. 150–158, Oct. 1995.*

Dahl et al., "Emulation of the Sparcle Microprocessor with the MIT Virtual Wires Emulation System", Proc. IEEE Workshop on FPGAs for Custom Computing, pp. 14–22, Apr. 1994.*

Synopsys, Inc. Model Source 3000 Series brochure copyright 1995.

Virtural Machine Works. Inc. VirtuaLogic Emulations System brochure copyright 1996.

*Primary Examiner*—Eric W. Stamber
*Assistant Examiner*—Douglas W. Sergent
(74) *Attorney, Agent, or Firm*—Donal E. Schreiber (57) ABSTRACT

A digital logic simulation/emulation system (20) operates in an engaged operating mode in which a digital-logic simulation process (22) transmits stimulation-control data to a hardware pod (32) for controlling stimulation of a digital logic circuit. In response to the stimulation-control data, the hardware pod (32) performs a stimulation-response cycle, and then sends response data from the digital logic circuit to the simulation process (22). The simulation process (22) and the hardware pod (32) may also operate in a disengaged operating mode in which each operates independently of the other without exchanging stimulation-control data or response data. Operation of the system (20) in the disengaged mode commences if a disengagement event occurs in the hardware pod (32). Operation of the system (20) in the disengaged mode terminates if the simulation process (22) sends stimulation-control data to the hardware pod (32), or if the hardware pod (32) sends response data to the simulation process (22).

9 Claims, 7 Drawing Sheets

U.S. PATENT DOCUMENTS

| | | | |
|---|---|---|---|
| 4,691,316 | * | 9/1987 | Phillips ................................. 371/20 |
| 4,744,084 | * | 5/1988 | Beck et al. ............................ 371/23 |
| 5,036,473 | * | 7/1991 | Butts et al. .......................... 364/489 |
| 5,068,852 | * | 11/1991 | Locke ................................. 371/16.2 |
| 5,136,590 | * | 8/1992 | Polstra et al. ....................... 371/16.2 |
| 5,146,460 | * | 9/1992 | Ackerman et al. .................... 371/23 |
| 5,226,047 | * | 7/1993 | Catlin ................................... 714/28 |
| 5,325,365 | * | 6/1994 | Moore et al. ........................ 371/16.2 |
| 5,353,243 | * | 10/1994 | Read et al. .......................... 364/578 |
| 5,369,593 | * | 11/1994 | Papamarcos et al. ............... 364/488 |
| 5,448,496 | * | 9/1995 | Butts et al. .......................... 364/489 |
| 5,452,231 | * | 9/1995 | Butts et al. .......................... 364/589 |
| 5,475,624 | * | 12/1995 | West .................................... 364/578 |
| 5,528,752 | * | 6/1996 | Kise et al. ....................... 395/183.05 |
| 5,539,901 | * | 7/1996 | Ramirez ................................. 14/28 |
| 5,546,562 | * | 8/1996 | Patel ..................................... 703/14 |
| 5,574,892 | * | 11/1996 | Christensen .......................... 703/28 |
| 5,612,891 | * | 3/1997 | Butts et al. .......................... 364/489 |
| 5,625,580 | * | 4/1997 | Read et al. .......................... 364/578 |
| 5,630,102 | * | 5/1997 | Johnson et al. ....................... 703/28 |
| 5,657,241 | * | 8/1997 | Butts et al. .......................... 364/489 |
| 5,661,662 | * | 8/1997 | Butts et al. .......................... 364/489 |
| 5,748,875 | * | 5/1998 | Tzori .................................... 714/29 |
| 5,771,370 | * | 6/1998 | Klein ..................................... 703/13 |
| 5,838,948 | * | 11/1998 | Bunza .................................. 395/500 |
| 5,946,472 | * | 8/1999 | Graves et al. ........................ 703/16 |
| 6,009,256 | * | 12/1999 | Tseng et al. .......................... 703/13 |

* cited by examiner

CONCURRENT HARDWARE-SOFTWARE CO-SIMULATION

This application claims the benefit of U.S. Provisional Patent Application No. 60/050,059 filed on Jun. 13, 1997, entitled "Method for Hardware-Software Co-Simulation."

BACKGROUND OF THE INVENTION

1. Field of the Invention

The present invention relates generally to digital logic simulation and emulation and, more particularly, to systems that stimulate a physical digital logic device included in the simulation or emulation, and retrieve responses produced by the stimulated logic device.

2. Description of the Prior Art

Various different software and hardware systems exist for simulating and/or emulating digital logic systems. An example of a widely used software system for simulating digital logic systems is an IEEE standard simulation programming language called Verilog. Various vendors, such as Cadence Design Systems of San Jose, Calif., offer compilers or interpreters for the Verilog simulation language. Software digital logic system simulators, such as Verilog, are routinely used for designing systems as physically small as individual integrated circuits ("ICs"), and for designing much larger digital logic systems that include numerous ICs.

Performing a Verilog simulation requires that a digital logic designer employ a computer program model for the system by aggregating into a simulation computer program various software modules. The software modules making up a Verilog model include modules for each digital logic circuit included in the simulation, for specifying interconnections among the Verilog logic circuit modules, and for specifying timing relationships among the interconnected Verilog logic circuit modules. It is readily apparent that preparing a simulation computer program for a digital logic system that includes numerous ICs is a herculean task if the designer(s) must individually write Verilog modules for each digital logic circuit included in the system.

Since in almost all instances IC manufacturers simulate their designs before fabricating even a prototype, in principle a simulation model exists for each IC that is left over from the IC's development. Moreover, an IC manufacturer probably retains that simulation computer model for maintaining, fixing and enhancing the IC's design. However, because an IC's simulation model reveals details about the IC's design that manufacturers would prefer not revealing to actual or potential competitors, IC manufacturers rarely, if at all, make available to designers of systems that use the IC the simulation computer model developed in designing the IC. Moreover, even if the simulation computer model used for designing the IC were available, it would includes details about the IC's operation that are unnecessarily complicated for designing a digital logic system that incorporates the IC as a component part. Consequently, using an IC's design simulation computer program in simulating a larger digital logic system that includes the IC would, in most instances, produce simulation results no better than those obtainable using a much simpler simulation model for the IC, while at the same time markedly increasing the amount of computation required to simulate the larger digital logic system.

Some manufacturers, generally the larger ones, make available to system designers simplified simulation modules for their IC products. There also exist vendors, frequently unrelated to an IC's manufacturer, who provide designers of digital logic systems with a simulation model for a specific IC, and/or libraries of simulation models for simulating a number of different ICs frequently from a number of different IC manufacturers. Even with these two possible sources for simplified IC simulation modules, they are unavailable for some ICs because their manufacturer's, generally smaller ones, do not develop them in a timely manner, and the products do not sell in sufficient volume to attract development of simulation modules by independent companies.

Regardless of the source, simplified simulation models may not faithfully reproduce the IC operation, e.g. simplified simulation model may contain latent bugs. It is readily apparent that a simulation model which contains a latent bug may appear to produce correct simulation results when used in simulating some digital logic systems, while producing incorrect simulation results in simulating other digital logic systems. Moreover, if a simulation model is not available for a particular IC, then the designer of a digital logic system that includes the IC must write such a simulation model with the attendant risk that the computer model will be insufficiently faithful in reproducing the IC's operation.

In addition to software digital logic simulation, various vendors, such as QuickTurn Design Systems of Mountain View, Calif. and Ikos Systems, Cupertino, Calif., offer hardware systems for emulating digital logic systems. An example of such a hardware simulation system is a Avatar™ emulation System offered by Ikos Systems. An Avatar emulation system divides a digital logic system, perhaps specified by a Verilog structural netlist, into separate parts which are then individually processed for configuring several Field Programmable Gate Arrays ("FPGAs"). The Avatar emulation then configures several FPGAs and suitably interconnects the FPGAs input and output pins to emulate the digital logic system.

One problem encountered in using FPGAs, either as configurable application specific integrated circuits ("ASICs") or in simulation or emulation, is that a significant amount of time is required to prepare a bit stream needed to configure the FPGA. The conventional way to prepare a FPGA configuration data file uses a technique referred to by those familiar with FPGAs as "place and route." While computer programs automate the "place and route" process for preparing a FPGA configuration data file, configuring a single FPGA using conventional "place and route" computer program may require several to tens of hours of computer time. Moreover, the conventional "place and route" computer program technique cannot guaranty producing a bit stream that will surely configure the FPGA for its intended purpose upon terminating the program's time consuming computation. Clearly, it is impractical to use a technique as cumbersome as the conventional "place and route" process for IC simulation or emulation if a dozen, or even one-half dozen, FPGA's must be configured before performing each simulation or emulation.

In addition to the polar opposites of digital logic system software simulation and digital logic system hardware emulation, there also exists intermediate systems that employ a hybrid of hardware and software for digital logic emulation or simulation. An example of a software-accessible, hardware IC emulation is called an in-circuit emulator ("ICE"). ICEs are commercially available which emulate a particular IC. In general, however, an ICE includes the physical IC that is being emulated, and adds to that IC additional circuitry which permits software monitoring of the IC's operation. Consequently, ICEs are comparatively inflexible, and there does not presently exist a general purpose ICE that will simulate any IC for which a simulation model exists.

There also exists another type of hybrid hardware and software system which incorporates a hardware IC model into a software digital logic simulation. An example of such a hardware IC model system is the ModelSource system marketed by Logic Modeling Group of Synopsys ("Synopsys") of Mountain View, Calif. To incorporate a hardware IC model into a digital logic simulation using the ModelSource system, a logic designer must plug an IC mounted on a special purpose adapter board into a ModelSource system. A ModelSource processor, such as a workstation, interconnects the ModelSource system to a local area network, such as an Ethernet, over which the ModelSource workstation communicates with another workstation which runs the simulation computer program. During the simulation, if a change occurs in a signal that is applied to an input pin of the hardware-modeled IC, the pin change is transmitted via the local area network to the ModelSource processor. The ModelSource computer program running on the processor formats the pin change for the ModelSource system and transmits it to that system. The ModelSource system then presents the pin change to the IC and senses any change which occurs in a signal present on an output pin of the IC. The ModelSource system then returns the output pin changes plus the corresponding timing information to the simulation computer program via the local area network. Various aspects of similar systems which incorporate a hardware IC model into a digital logic simulation are disclosed in U.S. Pat. Nos. 4,590,581, 4,635,218, 4,744,084, 5,146,460, 5,353,243 and 5,369,593.

Another example of a hybrid hardware and software system which incorporates a hardware IC model into a software digital logic simulation is disclosed in U.S. Pat. No. 5,748,875 entitled "Digital Logic Simulation/Emulation System" that issued May 5, 1998, on an application filed by Yiftach Tzori ("the '875 patent"). The system disclosed in this patent includes a hardware pod having configurable-logic ICs arranged to provide a plurality of stimulus/response cells which are coupled to a digital logic circuit. Similar to the Synopsys ModelSource system, the hardware pod is itself coupled to another computer that executes a computer program for a simulating digital logic system, such as a Verilog simulation computer program. During a stimulation-response cycle for the digital logic circuit, as specified by data received from the digital logic system simulation, the stimulus/response cells apply stimulus signals to the digital logic circuit, and receive response data from the digital logic circuit for transmission back to the digital logic system simulation.

The '875 patent discloses that the stimulation-response cycles of hardward pod of its hybrid hardware and software system are performed in lock-step with the software digital logic system simulation. That is, the digital logic system simulation computer program executes without communicating with the hybrid hardware and software system until such time as the simulation computer program must stimulate the digital logic circuit and receive that circuit's response to such stimulation. When the simulation computer program reaches such a state, it transmits data specifying the stimulation to be supplied to the digital logic circuit, and then pauses any processing that requires response data from the digital logic circuit until receiving such data. In many instances, lock-step synchronization between the simulation computer program and the digital logic circuit's stimulation-response cycles unnecessarily increases the time to perform a simulation.

In addition to simulating an IC, a converse situation arises in which a simulation model exists for a particular IC, but the IC itself is not available when a digital logic system designer wants to begin implementing and testing a digital logic system which incorporates the IC. Alternatively, even though an IC is available for use in implementing and testing a digital logic system's design, analogous to the use of an ICE in designing and debugging a digital logic system, a designer may want or need to observe and monitor the IC's interaction with other circuit elements, such as other ICs. Under either of these circumstances, a digital logic system designer may find it desirable to introduce digital logic signals into an implementation of a digital logic system that represent results obtained from a software simulation of one or more ICs.

In addition to a requirement to simulate or emulate an entire IC, there also exists a need to effectively and efficiently simulate or emulate only a portion of an IC. Presently, there exist companies which sell or license designs that form only a portion or core of an entire IC design. For example, such a enterprise may have a design for a CPU that it wishes to sell or license to a second enterprise which then incorporates the CPU design into the second enterprise's IC design. However, before the second enterprise buys or licenses the first enterprise's design, the second enterprise wants to be certain that the first enterprise's design works properly, and is compatible with the remainder of the second enterprise's IC design. In theory, the first enterprise could easily satisfy the second enterprise's need to inspect and test the first enterprise's design by providing the second enterprise with a simulation computer program's source code for the first enterprise's design. Unfortunately, the first enterprise is usually reluctant to provide the second enterprise with the simulation language program's source code because providing that level of design detail may, and most likely will, divulge to third parties proprietary design techniques which the first enterprise employs, and which provide the first enterprise with a competitive advantage. One solution to the preceding dilemma is if the first enterprise provides the second enterprise with a net list for the design which contains all of the design's details without revealing the proprietary design techniques. Unfortunately, incorporating a net list representation of a design into a simulation usually yields an undesirably, or even unacceptably, slow simulation.

BRIEF SUMMARY OF THE INVENTION

An object of the present invention is to provide an improved digital logic simulation/emulation system.

Another object of the present invention is to provide a digital logic simulation/emulation system that performs a simulation more quickly.

Another object of the present invention is to provide a digital logic simulation/emulation system that may be freed from lock-step synchronization between the simulation computer program and the digital logic circuit's stimulation-response cycles.

Briefly, the present invention is a digital logic simulation/emulation system that includes a computer program digital-logic simulation process executed by a digital computer for modeling a digital logic system. The digital logic simulation/emulation system also includes a hardware pod that is adapted for being coupled to a digital logic circuit. The hardware pod includes: a plurality of stimulus/response cells:
  1. for providing stimulus signals to the digital logic circuit during a stimulation-response cycle; and
  2. for receiving responses from the digital logic circuit during the stimulation-response cycle.

The hardware pod further includes a communication port for receiving:

1. stimulation-control data from the digital-logic simulation process to be transmitted to the stimulus/response cells for controlling stimulation of the digital logic circuit during the stimulation-response cycle; and
2. response data generated by the digital logic circuit in response to stimulation thereof during the stimulation-response cycle for transmission from the hardware pod to the digital-logic simulation process.

The digital-logic simulation process and the hardware pod are coupled together in the simulation/emulation system for exchanging stimulation-control data and response data.

The digital-logic simulation process and the hardware pod may operate in an engaged operating mode in which the digital-logic simulation process:

1. first transmits stimulation-control data to the hardware pod for controlling stimulation of the digital logic circuit by the stimulus/response cells during a single stimulation-response cycle; and
2. then receives from the hardware pod response data that reports the response of the digital logic circuit to stimulation during that stimulation-response cycle.

The digital-logic simulation process and the hardware pod may also operate in a disengaged operating mode which commences in response to a disengagement event occurring in the hardware pod while the hardware pod and the digital-logic simulation process are operating in the engaged operating mode. When such a disengagement event occurs, the hardware pod transmits a disengagement message to the digital-logic simulation process indicating to the digital-logic simulation process that the hardware pod is:

1. entering the disengaged operating mode; and
2. commencing execution of stimulation-response cycles without receiving additional stimulation-control data from the digital-logic simulation process.

The digital-logic simulation process, upon receiving the disengagement message from the hardware pod, commences operation in the disengaged operating mode in which the digital-logic simulation process continues execution without receiving response data from the hardware pod.

While the hardware pod and the digital-logic simulation process are operating in the disengaged operating mode, when an engagement event occurs within the hardware pod that requires communication with the digital-logic simulation process the hardware pod both:

1. transmits an engagement message to the digital-logic simulation process; and
2. enters the engaged operating mode.

Alternatively, the hardware pod may enter the engaged operating mode upon receiving an engagement message from the digital-logic simulation process. Analogously, when an engagement event occurs within the digital-logic simulation process that requires communication with the hardware pod, the digital-logic simulation process both:

1. transmits an engagement message to the hardware pod; and
2. enters the engaged operating mode.

Alternatively, the digital-logic simulation process may enter the engaged operating mode upon receiving an engagement message from the hardware pod.

An advantage of the improved digital logic simulation/emulation system is that it frees the digital-logic simulation process and the hardware pod from operating in lock-step with each other at the stimulation/response cycle of the digital logic circuit. Thus, the improved digital logic simulation/emulation system permits interaction between the digital-logic simulation process and the hardware pod to occur only at a higher level than at the stimulation/response cycle of the digital logic circuit, for example at an event level such as read, write or interrupt events of the digital logic circuit. These and other features, objects and advantages of the present invention will be understood or apparent to those of ordinary skill in the art from the following detailed description of the preferred embodiment as illustrated in the various drawing figures.

DETAILED DESCRIPTION

Figure 1:
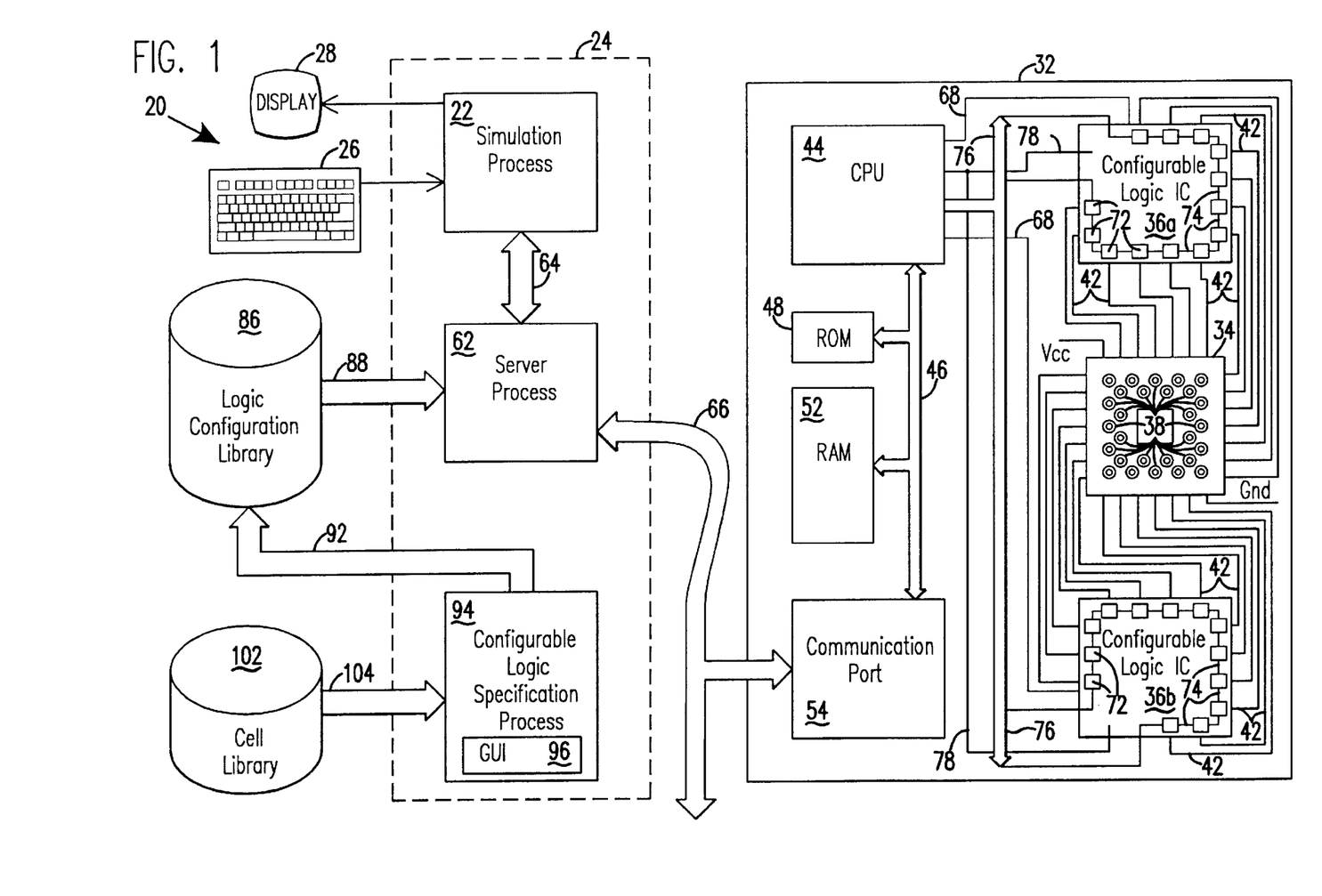
FIG. 1 is a block diagram depicting a digital logic simulation/emulation system in accordance with the present invention including a simulation process, a server process, a logic configuration library, and a hardware pod that includes a communication port, a RAM, a ROM, a CPU, one or more configurable-logic ICs, and a socket which may either receive a digital logic IC, or permit coupling the pod to a digital logic system, depending upon the use being made of the simulation/emulation system.

FIG. 1 is a block diagram depicting a digital logic simulation/emulation system in accordance with the present invention referred to by the general reference character 20. The digital logic simulation/emulation system 20 of FIG. 1 is that depicted and described in the '875 patent, that is hereby incorporated by reference. The digital logic simulation/emulation system 20 includes a computer program digital-logic simulation process 22 executed by a digital computer, indicated in FIG. 1 by a dashed line 24. The simulation process 22 models a digital logic system, and is preferably programmed in the a Verilog programming language. The digital computer 24 is preferably a Sun Microsystems, Inc. of Mountain View, Calif., SparcStation 4 workstation. The digital logic simulation/emulation system 20 also includes a keyboard 26 and a display 28 that are coupled to the simulation process 22 to permit monitoring of and interaction with the simulation process 22.

The digital logic simulation/emulation system 20 also includes a hardware pod 32 that, in the embodiment of the present invention illustrated in FIG. 1, is adapted to receive a digital logic IC by a zero insertion force ("ZIF") IC socket 34. In addition to the IC socket 34, the hardware pod 32 illustrated in FIG. 1 includes two (2) configurable-logic ICs 36a and 36b. All IC pin-receptacles 38 included in the IC socket 34 connect by individual printed circuit board traces 42 to the configurable-logic IC 36a or 36b.

The hardware pod 32 further includes a central processing unit ("CPU") 44 that preferably includes an Integrated Device Technology, Inc., of Santa Clara, Calif. R4650 MIPS R4000 derivative RISC microprocessor together with other ancillary ICs. A microprocessor bus 46 couples the CPU 44 to a read only memory ("ROM") 48, a random access memory ("RAM") 52 and to a communication port 54, which is preferably an Sonic Ethernet IC marketed by National Semiconductor, Inc. of Santa Clara, Calif. The ROM 48, which provides 512 K bytes of storage, holds only a minimum computer program required to boot the CPU 44 sufficiently to permit receiving additional computer programs through the communication port 54. The RAM 52 provides 16 M bytes of storage for:

1. a computer program executed by the CPU 44;
2. stimulation-control data used in programming the configurable-logic ICs 36a and 36b to stimulate a digital logic IC inserted into the IC socket 34 during a stimulation-response cycle; and
3. response data received by the configurable-logic ICs 36a and 36b from such digital logic IC during the stimulation-response cycle.

As depicted in FIG. 1, the digital logic simulation/emulation system 20 also includes a server process 62 which is coupled internally within the digital computer 24 by software to the simulation process 22 as indicated by a double-headed arrow 64. The server process 62 is also coupled by an Ethernet cable 66 to the hardware pod 32, and, if desired, to additional hardware pods 32 (not illustrated in FIG. 1). The server process 62 exchanges stimulation-control data and response data between the simulation process 22 and the hardware pod 32. During the transfer of stimulation-control data from the simulation process 22, the communication port 54 receives data to be transmitted to the configurable-logic IC 36a or 36b for controlling stimulation of the digital logic IC by the configurable-logic ICs 36a and 36b during the stimulation-response cycle. During a transfer of response data from the hardware pod 32, the communication port 54 transmits response data which the configurable-logic ICs 36a and 36b receive from the digital logic IC in response to stimulation thereof during the stimulation-response cycle.

The configurable-logic ICs 36a and 36b are both preferably AT6005 fine-grain FPGAs marketed by Atmel Corporation of San Jose, Calif. Each AT6005 FPGA is configured to operate as a particular digital logic circuit by supplying configuration data, usually formatted as a configuration bit-stream, to at least one configuration input pin 68 of the FPGA. Within the FPGA, this configuration data moves via a built-in shift-register through the FPGA's symmetric matrix so that after a specified number of bits have been supplied to the FPGA, the FPGA is fully configured. In the digital logic simulation/emulation system 20, the configuration data upon being loaded into the configurable-logic ICs 36a and 36b establishes within the configured FPGA a bit-slice architecture in which a plurality of stimulus/response cells 72 are located around the FPGA's symmetric matrix's periphery. The configuration data also causes each of the stimulus/response cells 72 to be coupled through a FPGA programmable I/O cell, a FPGA pin, and one of the traces 42 of the hardware pod 32 to a specific IC pin-receptacle 38 of the ZIF IC socket 34.

In addition to forming the stimulus/response cells 72 that are coupled to the IC pin-receptacles 38, loading the configuration data into the configurable-logic ICs 36a and 36b also interconnects the stimulus/response cells 72 to each other by shift-register links 74 thereby establishing a shift-register that extends through the stimulus/response cells 72. The shift-register formed within the configurable-logic ICs 36a and 36b by the interdigitated stimulus/response cells 72 and shift-register links 74 begins and ends at separate FPGA pins. The shift-register thus established by the configuration data loaded into the configurable-logic ICs 36a and 36b permits downloading into the stimulus/response cells 72 via a stimulus/response data-bus 76 stimulation-control data of a bit-slice data stream which specifies stimulation of the digital logic IC by the configurable-logic ICs 36a and 36b during the stimulation-response cycle. The shift-register also permits uploading from the stimulus/response cells 72 of the configurable-logic ICs 36a and 36b via the stimulus/response data-bus 76 response data of a bit-slice data stream that reports the response of the digital logic IC to stimulation during the stimulation-response cycle.

The CPU 44 transmits an operating-mode bit to each configurable-logic ICs 36 via a signal-line included in a control signal bus 78. One state of the operating-mode bit directs the configurable-logic ICs 36 to shift data along the shift-register formed by the interconnected stimulus/response cells 72. The other state of the operating-mode bit directs the configurable-logic ICs 36 to perform a stimulation-response cycle.

To supply logic-configuration data to the configurable-logic ICs 36a and 36b, the digital logic simulation/emulation system 20 also includes a logic-configuration library 86 which stores a configuration-data file that contains the logic-configuration data loaded into the configurable-logic ICs 36a and 36b. As indicated by an arrow 88, the logic-configuration library 86 is coupled to the server process 62 which permits the server process 62 to retrieve the configuration-data file from the logic-configuration library 86 and transmit the logic-configuration data to the hardware pod 32 for configuring the configurable-logic ICs 36a and 36b.

As indicated by an arrow 92 in FIG. 1, the files present in the logic-configuration library 86 are prepared by a configurable-logic specification process 94 that is executed by the digital computer 24. The configurable-logic specification process 94 preferably includes a graphic user interface ("GUI") computer program 96 which an operator uses in specifying characteristics of a digital logic IC.

The digital logic simulation/emulation system 20 includes a configurable-logic cell-library 102, depicted in FIG. 1. The configurable-logic cell-library 102 stores, among other data, a set of configuration data specifying, for each different type of stimulus/response cell 72, a pre-established interconnection of several configurable-logic cells included in the configurable-logic ICs 36a and 36b. The configurable-logic cell-library 102 also stores, as a separate file, a list of the different types of stimulus/response cells 72 for which configuration data exists in the configurable-logic cell-library 102. The list of different types of stimulus/response cells 72 for which configuration data exists in the configurable-logic cell-library 102 facilitates adding new types of stimulus/response cells 72 to those already specified by the configurable-logic cell-library 102. As indicated by the arrow 104, the configurable-logic specification process 94 retrieves data, including configuration data, from the configurable-logic cell-library 102 for use in specifying and in compiling the configuration data to be loaded into the configurable-logic ICs 36a and 36b.

Engaged Operating Mode of the System 20

Figure 2:
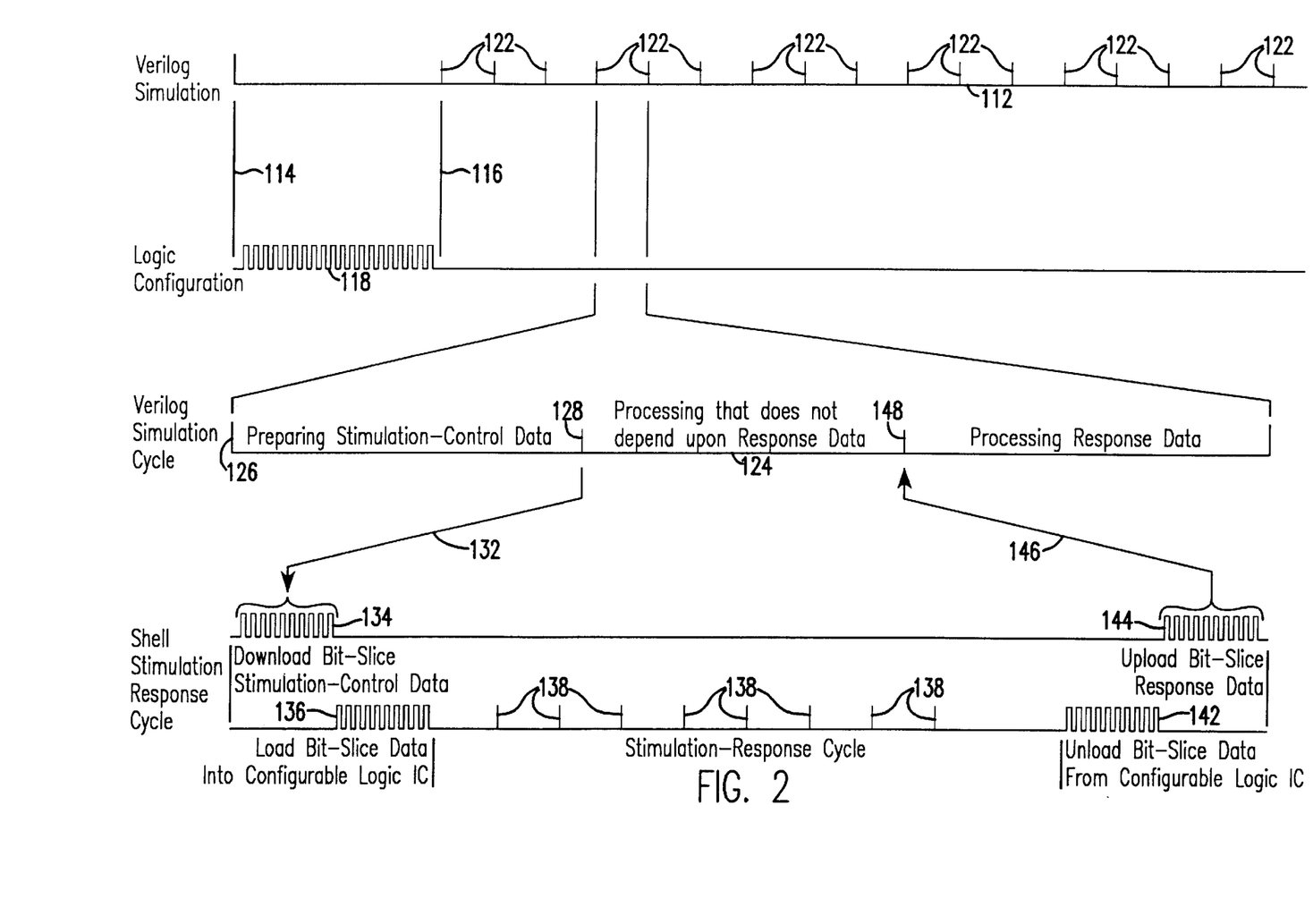
FIG. 2 is a timing diagram illustrating simulation or emulation of digital logic using the simulation/emulation system depicted in FIG. 1 specifically depicting a single stimulation-response cycle.

Referring now to the timing diagram of FIG. 2 that illustrates the engaged mode operation of the digital logic simulation/emulation system 20, a horizontal line 112 at the top of FIG. 2 depicts execution of the computer program digital-logic simulation process 22, such as the preferred Verilog simulation. The simulation process 22 commences at the left hand end of the horizontal line 112 with an initialization interval for the simulation process 22 that begins at a vertical line 114 and concludes at a vertical line 116. During the initialization interval, as illustrated by a pulse train 118 the server process 62 retrieves logic-configuration data from the logic-configuration library 86 and transmits such data to the hardware pod 32. Within the hardware pod 32, the logic configuration data is loaded into the configurable-logic ICs 36a and 36b thereby configuring the configurable-logic ICs 36a and 36b for the remainder of the simulation. After completing the initialization interval, the simulation process 22 performs a sequence of simulation cycles, which in the timing diagram of FIG. 2 occur between immediately adjacent pairs of short vertical lines 122.

A horizontal line 124 about the middle of FIG. 2 illustrates a typical simulation cycle of the simulation process 22. During an initial interval in the simulation cycle between a vertical line 126 and a vertical line 128, the simulation process 22 prepares stimulation-control data to be transmitted to the hardware pod 32 for stimulating a digital logic IC inserted into the IC socket 34. After the simulation process 22 has prepared all the device input data required to stimulate the digital logic IC, as indicated by an arrow 132 a "shell" module included in the simulation process 22 downloads the bit-slice stimulation-control data through the server process 62 into the RAM 52 of the hardware pod 32. The "shell" module included in the simulation process 22 represents the digital logic IC within the simulation computer program. In FIG. 2, a pulse train 134 indicates downloading of the bit-slice stimulation-control data through the server process 62 into the RAM 52. After the shell module has downloaded the bit-slice data into the hardware pod 32, the simulation process 22 may resume the simulation to perform processing that does not depend upon response data from the digital logic IC plugged into the IC socket 34.

After the bit-slice data has been loaded into the RAM 52, via the shift-register formed by the shift-register links 74 interconnecting adjacent stimulus/response cells 72, the computer program executed by the CPU 44 fetches the bit-slice stimulation-control data from the RAM 52 and loads that data into the configurable-logic ICs 36a and 36b as indicated by a pulse train 136 in FIG. 2. Loading the stimulation-control data into the configurable-logic ICs 36a and 36b specifies the stimulus signals which various stimulus/response cells 72 are to supply to digital logic IC during the stimulation-response cycle.

After the bit-slice stimulation-control data has been loaded into the configurable-logic ICs 36a and 36b, to perform the stimulation-response cycle state machines, respectively included in each configurable-logic ICs 36a and 36b, cause a timing generator, also included in each configurable-logic ICs 36a and 36b, to transmit a sequence of timing pulses, indicated in FIG. 2 by vertical lines 138, to all of the stimulus/response cells 72. During the stimulation-response cycle, there can be no fewer that two (2) timing pulses transmitted by the timing generator, and there are preferably eight (8) timing pulses transmitted by the timing generator. During the successive time intervals established by the timing pulses transmitted by the timing generator, each individual stimulus/response cell 72, in accordance with the logic-configuration data loaded into the configurable-logic ICs 36a and 36b and in accordance with the stimulation-control data loaded into the stimulus/response cells 72, transmits a stimulus signal to the digital logic IC plugged into the IC socket 34 and/or receives a response signal from the IC. Transmission of all the pulses by the timing generator concludes the stimulation-response cycle, and the responses of the digital logic IC to the stimulus signals are present in various stimulus/response cells 72.

At the conclusion of the stimulation-response cycle, via the shift-register formed by the shift-register links 74 interconnecting adjacent stimulus/response cells 72, the computer program executed by the CPU 44 retrieves the bit-slice response data from the configurable-logic ICs 36a and 36b, indicated by a pulse train 142 in FIG. 2, and stores that data into the RAM 52. After the response data has been loaded into the RAM 52, the communication port 54 retrieves that data from the RAM 52, indicated by the pulse train 144, and transmits the response data through the server process 62 back to the shell module of the simulation process 22 as indicated by the arrow 146 in FIG. 2.

After the simulation process 22 receives the response data, the simulation process 22 commences a final phase of the simulation cycle, which begins at a vertical line 148, during which the computer program digital-logic simulation process 22 processes response data from the digital logic IC. After the simulation process 22 completes processing of the response data, it immediately commences the next simulation cycle.

Engaged and Disengaged Mode Operation of the System 20

Figure 3:
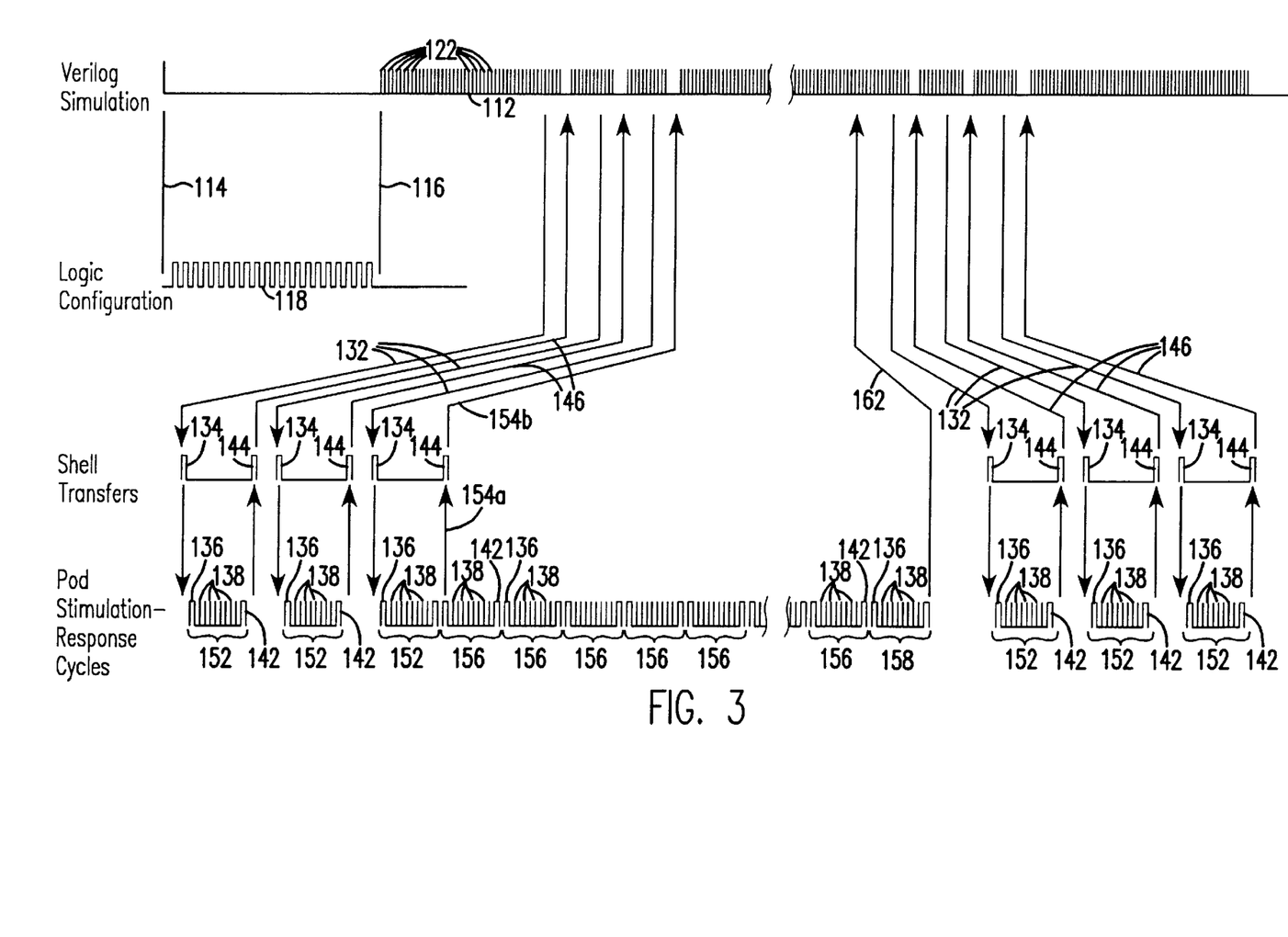
FIG. 3 is a timing diagram illustrating simulation or emulation of digital logic using the simulation/emulation system depicted in FIG. 1 for several stimulation-response cycles when operating first in engaged mode, then in disengaged mode, and finally again resuming operation in the engaged mode responsive to the hardware pod detecting a requirement for engagement.

FIG. 3 illustrates operation of the digital logic simulation/emulation system 20 both in the engaged and disengaged operating modes. As with the timing diagram of FIG. 2, the horizontal line 112 in FIG. 3 depicts execution of the computer program digital-logic simulation process 22. In the illustration of FIG. 3, the simulation process 22 and the hardware pod 32 initially begin operating in the engaged mode identically to the operation illustrated in FIG. 2. In the illustration of FIG. 3, engaged mode operation continues for three (3) successive engaged-mode stimulation-response cycles 152. During the third engaged-mode stimulation-response cycle 152, the hardware pod 32 detects occurrence of a disengagement event. Accordingly, at the end of that engaged-mode stimulation-response cycle 152 the hardware pod 32 transmits a disengage message, illustrated by lines 154a and 154b in FIG. 3, to the simulation process 22. Immediately after the hardware pod 32 transmits the disengage message to the simulation process 22, the hardware pod 32 begins to autonomously execute successive disengaged-mode stimulation-response cycles 156. During disengaged-mode stimulation-response cycles 156, the hardware pod 32 does not receive stimulation-control data from the simulation process 22, and does not transmit response data to the simulation process 22. Rather, during each of the disengaged-mode stimulation-response cycles 156 the hardware pod 32 uses stimulation-control data which the hardware pod 32 has previously downloaded from the simulation process 22 and has stored into the RAM 52. Correspondingly, the simulation process 22 upon receiving the disengage message from the hardware pod 32 immediately begins autonomously executing successive simulation cycles halting transmission of stimulation-control data to the hardware pod 32, and receipt of response data from the hardware pod 32.

In the illustration of FIG. 3, during a final disengaged-mode stimulation-response cycles 158 the hardware pod 32 detects a need to transmit response data to the simulation process 22. At the end of the disengaged-mode stimulation-response cycle 158, the hardware pod 32 transmits the response data to the simulation process 22, indicated by a line 162 in FIG. 3, and re-enters the engaged operating mode. Operating in the disengaged mode, the simulation process 22 upon receiving response data from the hardware pod 32 appropriately terminates disengaged mode operation, and resumes operating in the engaged mode. Three engaged-mode stimulation-response cycles 152, depicted at the right-hand side of FIG. 3, illustrate continuing engaged mode operation by the digital logic simulation/emulation system 20. As indicated in FIG. 3 by a gap between the final disengaged-mode stimulation-response cycle 158 and the immediately adjacent engaged-mode stimulation-response cycle 152, a delay may occur between transmission of response data from the hardware pod 32 to the simulation process 22, indicated by the line 162, and the resumption of engaged mode operation by the digital logic simulation/emulation system 20. Such a delay may occur while the simulation process 22 performs some portion of the digital logic simulation that must be completed before the simulation process 22 may re-enter the engaged operating mode.

Figure 4:
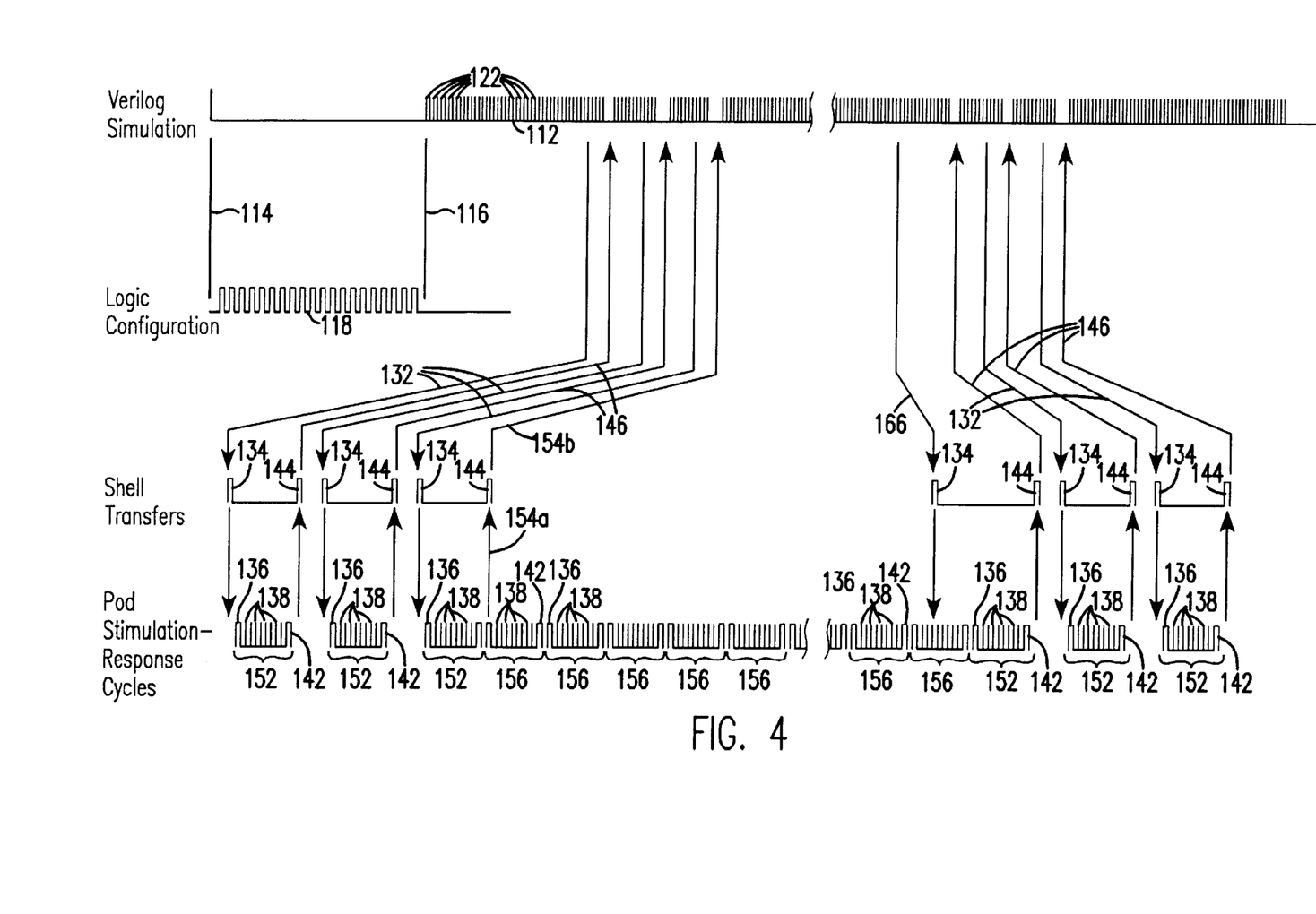
FIG. 4 is a timing diagram similar to that of FIG. 3 illustrating operation of the simulation/emulation system for several stimulation-response cycles first in engaged mode, then in disengaged mode, and finally again resuming operation in the engaged mode responsive to the simulation detecting a requirement for engagement.

Similar to FIG. 3, the timing diagram of FIG. 4 illustrates operation of the digital logic simulation/emulation system 20 both in the engaged and disengaged mode. However, operation of the digital logic simulation/emulation system 20 depicted in FIG. 4 differs from that depicted in FIG. 3 in that during disengaged mode operation an event occurring in the simulation process 22, rather than in the hardware pod 32, causes the digital logic simulation/emulation system 20 to re-enter the engaged operating mode. Upon occurrence of the event requiring re-entering engaged mode operation in the simulation process 22, the simulation process 22 transmits stimulation-control data to the hardware pod 32 indicated by a line 166 in FIG. 4. Since transmission of the stimulation-control data from the simulation process 22 to the hardware pod 32 is not synchronized with execution of disengaged-mode stimulation-response cycles 156 by the hardware pod 32, the stimulation-control data may arrive at the hardware pod 32 during execution of disengaged-mode stimulation-response cycles 156 by the hardware pod 32. Upon receiving the stimulation-control data, the hardware pod 32 completes execution of the final disengaged-mode stimulation-response cycle 156, and then immediately resumes executing engaged-mode stimulation-response cycles 152. It should be noted that if the event requiring re-entry to engaged mode operation occurs in the simulation process 22, then the final disengaged-mode stimulation-response cycle 158 depicted in FIG. 3 does not occur in the hardware pod 32.

In summary, if the digital logic simulation/emulation system 20 is operating in engaged mode, only the hardware pod 32 detects occurrence of an event that commences operating in the disengaged mode. Upon detecting such an event, the hardware pod 32 transmits a disengage message to the simulation process 22, and both the simulation process 22 and the hardware pod 32 commence disengaged mode operation. While the digital logic simulation/emulation system 20 operates in the disengaged mode, either the simulation process 22 or the hardware pod 32 may detect occurrence of an event that requires resuming engaged mode operation. Upon detection of such an event, either the simulation process 22 sends stimulation-control data to the hardware pod 32, or the hardware pod 32 sends response data to the simulation process 22. An exchange either of stimulation-control or of response data between the simulation process 22 and the hardware pod 32 signals that the digital logic simulation/emulation system 20 is to re-enter the engaged operating mode.

Figures 5, 5A:
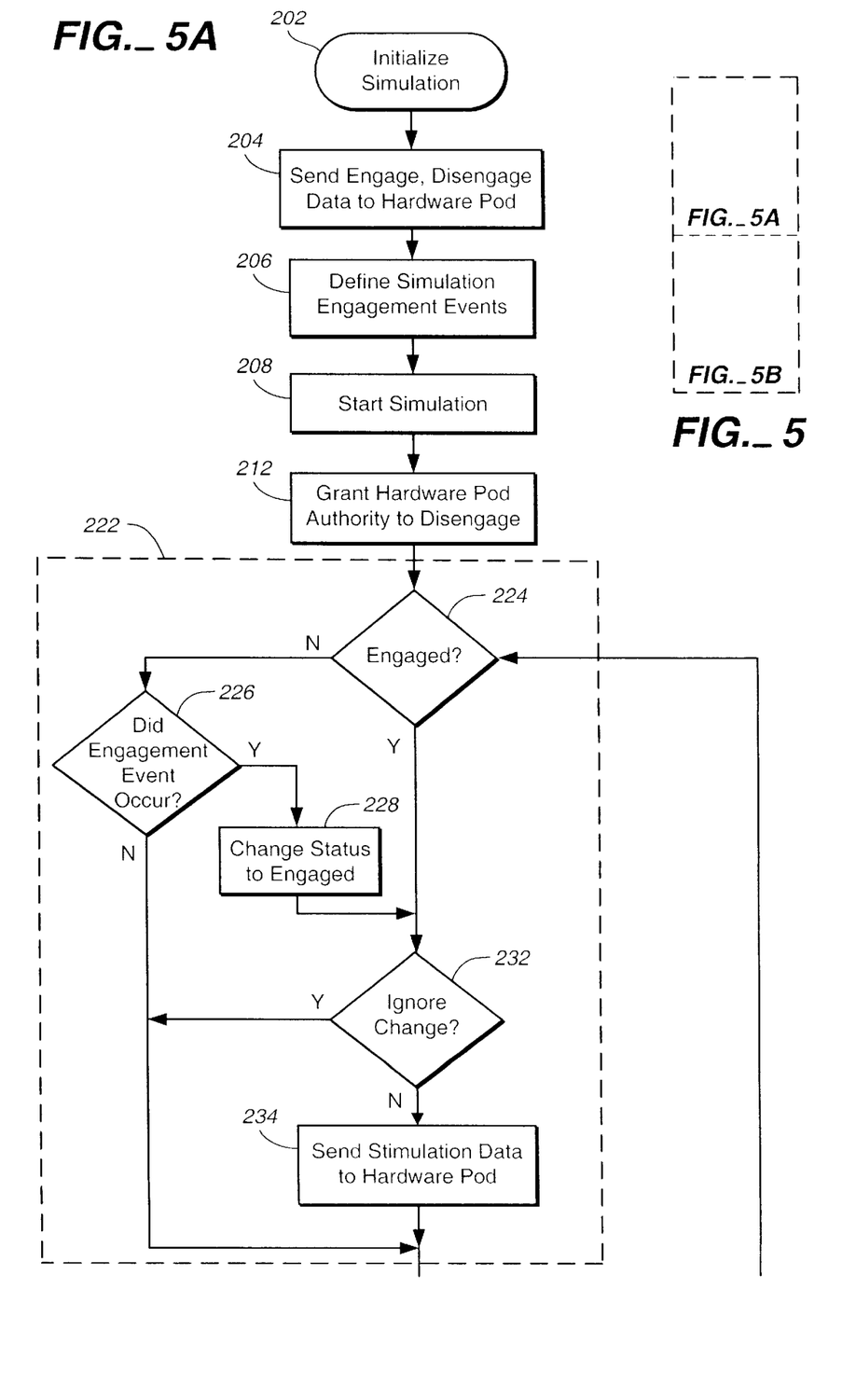
FIG. 5 depicts a relationship between FIGS. 5A and 5B, the combined FIGS. 5A and 5B forming a decisional flow chart that depicts operation of the simulation process, both in the engaged and disengaged operating modes, for exchanging data and control messages between the simulation process and the hardware pod.
Figure 5B:
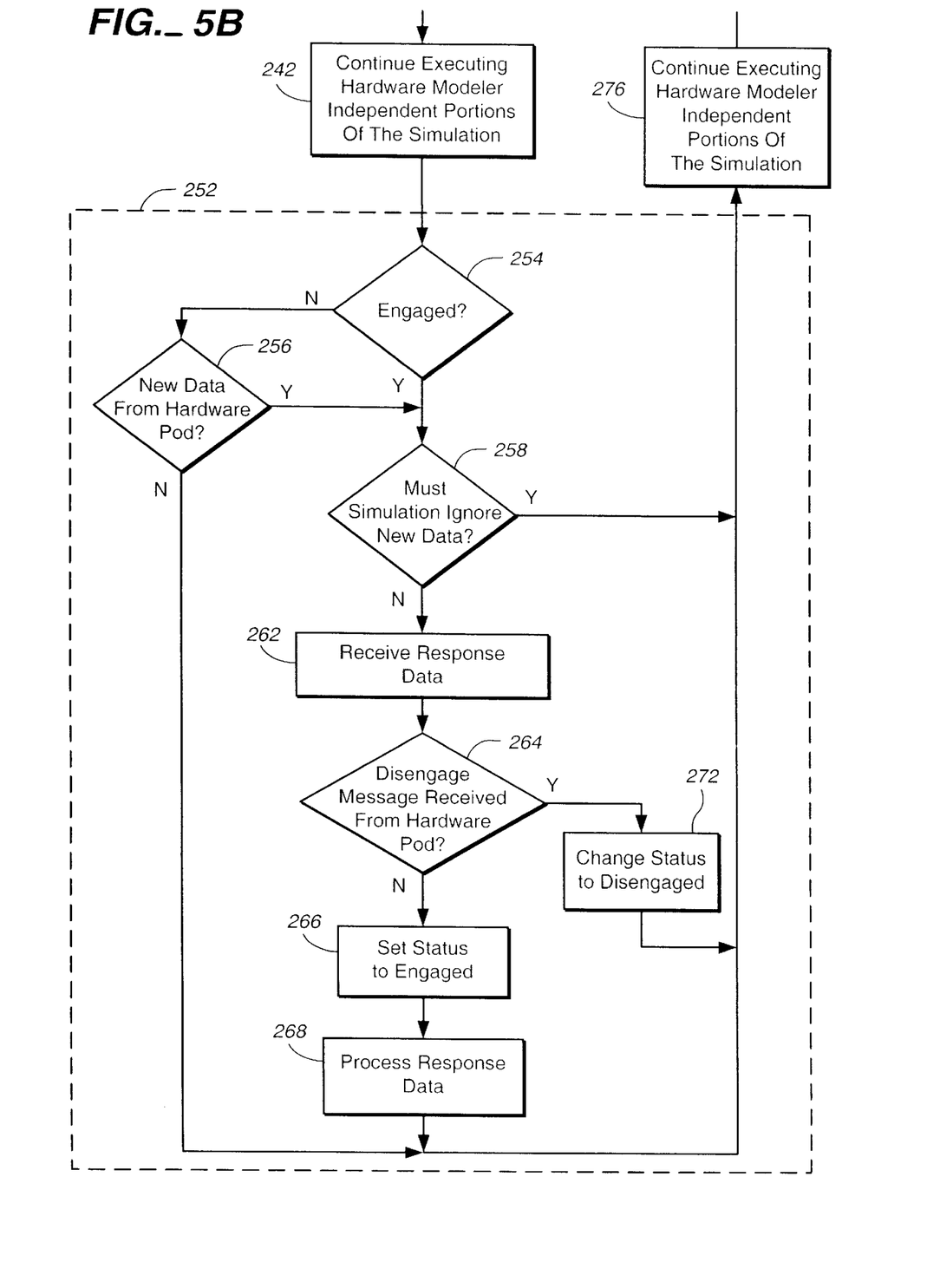

The flow chart formed by a combination of FIGS. 5A and 5B depicts operation of the simulation process 22, both when operating in the engaged and in the disengaged modes, for exchanging data and control messages between the simulation process 22 and the hardware pod 32. The illustration provided by the combined FIGS. 5A and 5B depicts in a single flow chart both transmission of data and messages from the simulation process 22 to the hardware pod 32, and conversely receipt by the simulation process 22 of data and messages from the hardware pod 32. However, the preferred embodiment of the simulation process 22 employs separate, independently executed routines for performing each of these respective functions. Consequently, during intervals in which the simulation process 22 is not actively exchanging data or messages with the hardware pod 32, separation of these data exchange functions into two independent routines permits the simulation process 22 to execute other routines for simulating portions of the digital logic system that do not require receiving response data from the hardware pod 32 for their execution.

Operation of the simulation process 22 for exchanging data and control messages with the simulation process 22 begins with initialization of the simulation process 22 in processing block 202, a process which the timing diagrams of FIGS. 2, 3 and 4 illustrate occurring between the lines 114 and 116. After the simulation process 22 has been initialized, the simulation process 22 in processing block 204 transmits data to the hardware pod 32 that specifies engagement and disengagement events that are to be detected by the hardware pod 32. After the hardware pod 32 has received data specifying engagement and disengagement events, the simulation process 22 in processing block 206 then defines events to which the simulation process 22 itself must respond by entering the engaged operating mode if when such events occur the digital logic simulation/emulation system 20 is operating in the disengaged mode. Thus, only after the simulation process 22 and the hardware pod 32 are both respectively prepared for the occurrence of disengagement and engagement events does execution of the simulation process 22 for simulating the digital logic system actually commence in processing block 208.

After execution of the simulation process 22 for simulating the digital logic system commences, the simulation process 22 in processing block 212 sends a message to the hardware pod 32 granting authority for the hardware pod 32 to detect and respond both to disengagement and engagement events. After the hardware pod 32 has been enabled for responding to disengagement and engagement events, at some point in simulating the digital logic system the simulation process 22 begins executing a stimulation-data-transmission routine, enclosed within a dashed line 222 in FIG. 5A, for transmitting stimulation-control data to the hardware pod 32. Upon commencing execution of the stimulation-data-transmission routine, the simulation process 22 first determines in decision block 224 if the digital logic simulation/emulation system 20 is operating in the engaged operating mode. If the digital logic simulation/emulation system 20 is not operating in the engaged mode, i.e. the digital logic simulation/emulation system 20 is operating in the disengaged mode, the simulation process 22 then determines in decision block 226 if any of the engagement events defined previously during execution of processing block 206 has occurred. If in decision block 224 the simulation process 22 determines that an engagement event has occurred, then in processing block 228 the simulation process 22 changes its operating status from disengaged to engaged. Consequently, whenever the simulation process 22 determines in decision block 232 that the change in status from disengaged to engaged must be ignored for the time being, the simulation process 22 either has determined in decision block 224 that the digital logic simulation/emulation system 20 is already operating in the engaged mode, or the simulation process 22 has just established engaged mode operating status in processing block 228. Conversely, if the simulation process 22 in decision block 232 determines that it need not ignore, at this time, a change from disengaged operating mode to engaged operating mode, then in processing block 234 the simulation process 22 transmits stimulation-control data to the simulation process 22 as indicated in FIGS. 2, 3 and 4 by arrows 132. Accordingly as depicted in FIG. 5A, either transmitting stimulation-control data to the hardware pod 32 in processing block 234 or omitting transmission of stimulation-control data to the hardware pod 32 completes execution of the stimulation-data-transmission routine.

Upon completing execution of the stimulation-data-transmission routine, if there exist other activities to be be executed before the simulation process 22 must transmit stimulation-control data to the hardware pod 32, then such routines are executed in processing block 242. At some point in simulating the digital logic system the simulation process 22 completes, for the time being, performing activities needed for simulating portions of the digital logic system that do not require transmitting stimulation-control data to the hardware pod 32. It is appropriate for the stimulation-data-transmission routine to ignore, for the time being, response data from the hardware pod 32 signaling a change in status from disengaged to engaged if, because of the present state of the digital logic simulation, the simulation process 22 must complete some portion of the digital logic simulation before the simulation process 22 may re-enter the engaged operating mode. Such a condition produces the delay between the final disengaged-mode stimulation-response cycle 158 depicted in FIG. 3 and the immediately adjacent engaged-mode stimulation-response cycle 152. Upon the occurrence of that event, the simulation process 22 then begins executing a response-data-reception routine, enclosed within a dashed line 252 in FIG. 5B, for receiving response data from the hardware pod 32.

Upon commencing execution of the response-data-reception routine, the simulation process 22 first determines in decision block 254 if the digital logic simulation/emulation system 20 is operating in the engaged operating mode. If the digital logic simulation/emulation system 20 is not operating in the engaged mode, i.e. the digital logic simulation/emulation system 20 is operating in the disengaged mode, the simulation process 22 then determines in decision block 256 if new data has arrived from the hardware pod 32. If the simulation process 22 determines in decision block 254 that the digital logic simulation/emulation system 20 is operating in the engaged mode, or if in decision block 256 the simulation process 22 determines that new data has arrived from the hardware pod 32, then the simulation process 22 in decision block 258 determines if, because of the present state of the digital logic simulation, the simulation process 22 must ignore, for the time being, the new data received from the hardware pod 32. If the simulation process 22 determines in decision block 258 that it need not ignore, at this time, the new data received from the hardware pod 32, then in processing block 262 the simulation process 22 receives the new data into the simulation process 22.

After receiving new data into the simulation process 22, the simulation process 22 in decision block 264 determines if the new data from the hardware pod 32 is a disengage message. If a disengage message has not been received from the hardware pod 32, then regardless of the present operating status the simulation process 22 in processing block 266 sets the operating status of the simulation process 22 to engaged. After setting the operating status of the simulation process 22 to engaged, then the simulation process 22 in processing block 268 performs that portion of the simulation process 22 whose processing requires new response data from the hardware pod 32.

If in processing block 262 the simulation process 22 determines that the new data received from the hardware pod 32 is a disengage message, then in processing block 272 the simulation process 22 sets its operating mode to disengaged. Changing the operating mode of the simulation process 22 to disengaged, or processing the response data newly received from the hardware pod 32 in processing block 268, or ignoring newly received response data in decision block 258, or determining in decision block 256 that new data has not arrived from the hardware pod 32 completes execution of the response-data-reception routine.

Upon completing execution of the response-data-reception routine, if there exist other activities for simulating portions of the digital logic system that do not require sending stimulation-control data to the hardware pod 32 that are then awaiting execution, such routines are executed in processing block 276. At some point in simulating the digital logic system the simulation process 22 again completes, for the time being, executing routines for simulating portions of the digital logic system that do not require sending stimulation-control data to the hardware pod 32, the simulation process 22 then returns to again execute the stimulation-data-transmission routine beginning with decision block 224.

Figure 6:
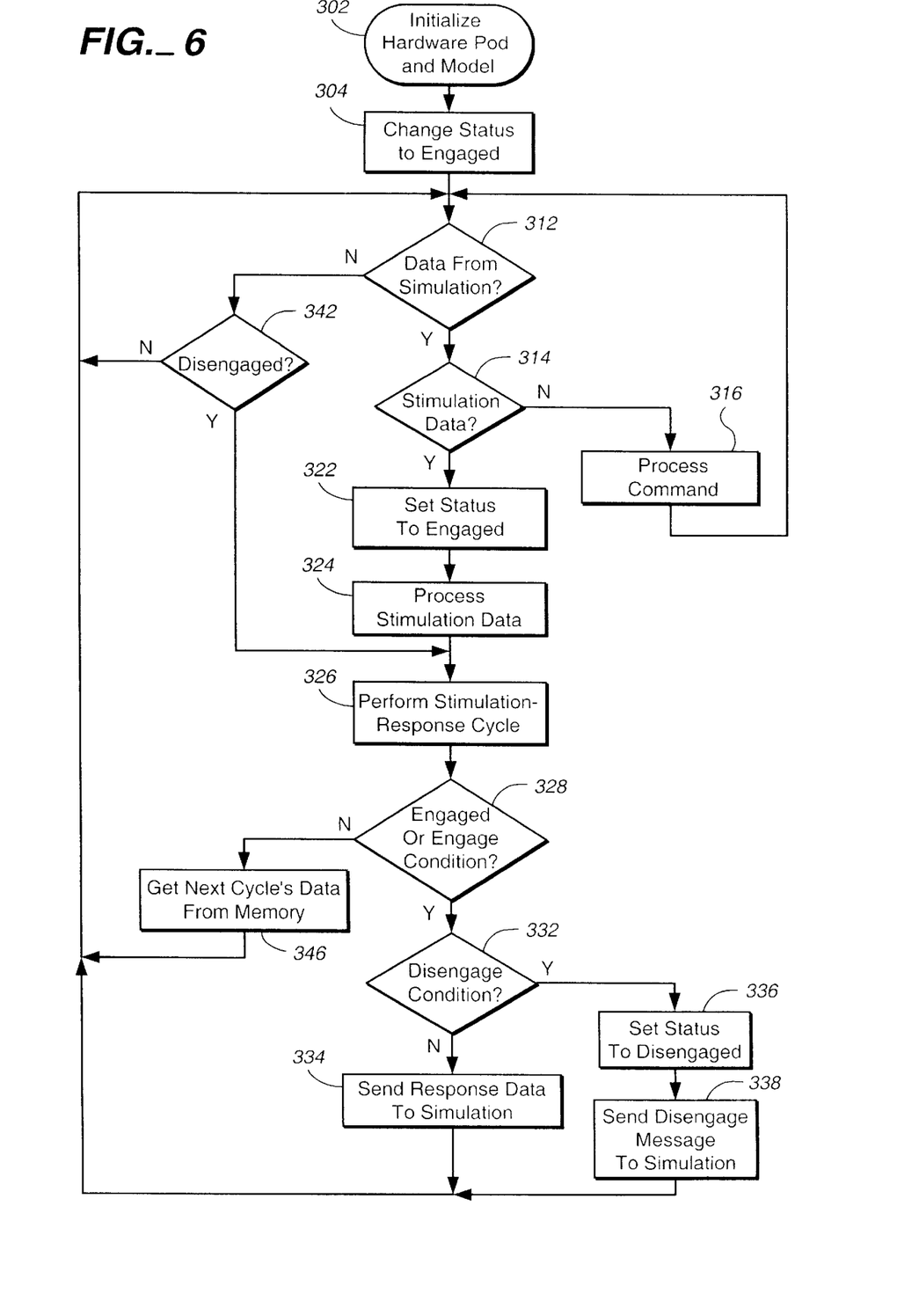
FIG. 6 is a decisional flow chart that depicts operation of the hardware pod, both in the engaged and disengaged operating modes, for exchanging data and control messages between the hardware pod and the simulation process.

The flow chart of FIG. 6 depicts operation of the hardware pod 32, both when operating in the engaged and in the disengaged modes, for exchanging data and control messages between the hardware pod 32 and the simulation process 22. Operation of the hardware pod 32 for exchanging data and control messages with the simulation process 22 begins in processing block 302 with initialization of the hardware pod 32 and the model. For the preferred embodiment of the hardware pod 32 implemented using the configurable-logic ICs 36a and 36b, executing processing block 302 includes loading configuration data into the configurable-logic ICs 36a and 36b, a process which the timing diagrams of FIGS. 2, 3 and 4 illustrate occurring between the lines 114 and 116. If a technology other than the preferred configurable-logic ICs 36a and 36b were to be used for providing stimulation signals to the IC pin-receptacle 38 and for receiving response data supplied to the IC pin-receptacle 38, then a different process compatible with the alternative technology would necessarily be required for initializing the hardware pod 32 and the model.

After the hardware pod 32 and the model have been initialized, then the hardware pod 32 in processing block 304 ensures that its operation begins in the engaged operating mode. After establishing the engaged operating mode, the hardware pod 32 first determines in decision block 312 if data has arrived from the simulation process 22. If data has arrived from the simulation process 22, then the hardware pod 32 in decision block 314 determines if the data is stimulation-control data. If the data is not stimulation-control data, then the hardware pod 32 in processing block 316 processes the data as a command being sent from the simulation process 22 to the hardware pod 32. Accordingly, the hardware pod 32 receives in processing block 316 data that the simulation process 22 sends to the hardware pod 32 during execution of processing block 204 specifying engagement and disengagement events that are to be detected by the hardware pod 32. Similarly, the hardware pod 32 receives in processing block 316 data that the hardware pod 32 sends to the simulation process 22 during execution of processing block 212 granting the hardware pod 32 authority to detect and respond both to disengagement and engagement events.

If data received from the hardware pod 32 is stimulation-control data, then in processing block 322 the hardware pod 32 sets the operating status of the hardware pod 32 to engaged. After setting the operating status of the hardware pod 32 to engaged, the hardware pod 32 in processing block 324 processes the stimulation-control data including loading the bit-slice stimulation-control data into the configurable-logic ICs 36a and 36b as indicated by the pulse train 136 in FIG. 2. After processing the stimulation-control data in processing block 324, the hardware pod 32 in processing block 326 then performs the stimulation-response cycle as described in the '875 patent.

After performing the stimulation-response cycle, the hardware pod 32 in decision block 328 determines either if the digital logic simulation/emulation system 20 is operating in the engaged mode, or if an engage event occurred during the stimulation-response cycle. If the digital logic simulation/emulation system 20 is operating in the engaged mode or if an engage event occurred, then the hardware pod 32 in decision block 332 determines if a disengage condition has occurred during the most recent stimulation-response cycle. If a disengage condition has not occurred, then the hardware pod 32 in processing block 334 sends the response data to the simulation process 22. If, however, a disengage event occurred during the most recent stimulation-response cycle, then in processing block 336 the hardware pod 32 sets its operating status to disengaged. After entering the disengaged operating mode in processing block 336, the hardware pod 32 in processing block 338 sends the disengage message to the simulation process 22 as indicated by the lines 154a and 154b in FIGS. 3 and 4.

If in decision block 312 the hardware pod 32 determines that data has not been received from the digital logic simulation/emulation system 20, then in decision block 342 the hardware pod 32 determines whether the digital logic simulation/emulation system 20 is operating in the disengaged mode. If the digital logic simulation/emulation system 20 is operating in the disengaged mode, then the hardware pod 32 in processing block 326 immediately performs the stimulation-response cycle using stimulation-control data previously downloaded from the simulation process 22 and stored into the RAM 52. After performing the stimulation-response cycle in processing block 326, the hardware pod 32 determines in decision block 328 either if the digital logic simulation/emulation system 20 is operating in the engaged mode, or if an engage event occurred during the stimulation-response cycle. Since the digital logic simulation/emulation system 20 is operating in the disengaged mode, if an engage event did not occur during the most recent stimulation-response cycle, then the hardware pod 32 in processing block 346 fetches stimulation-control data from the RAM 52 to be used during the next stimulation-response cycle performed in processing block 326.

Operating in the engaged mode either after the hardware pod 32 sends response data to the simulation process 22 in processing block 334 or after executing decision block 342, the hardware pod 32 enters a wait state (not separately depicted in FIG. 6) until the hardware pod 32 receives the next stimulation-control data from the simulation process 22. After new stimulation-control data subsequently arrives from the simulation process 22, the hardware pod 32 exits the wait state and resumes execution at decision block 312. Alternatively, operating in the disengaged mode either after the hardware pod 32 sends the disengage message to the simulation process 22 in processing block 338, or after the hardware pod 32 in processing block 346 fetches stimulation-control data from the RAM 52 to be used during the next stimulation-response cycle, the hardware pod 32 immediately returns to decision block 312 to determine if new stimulation-control data arrived from the simulation process 22 during the previous stimulation-response cycle performed in processing block 326.

Industrial Applicability

The present invention is widely applicable throughout industry to assist in the design, development and refining of hardware systems that include digital logic.

Although the present invention has been described in terms of the presently preferred embodiment, it is to be understood that such disclosure is purely illustrative and is not to be interpreted as limiting. Consequently, without departing from the spirit and scope of the invention, various alterations, modifications, and/or alternative applications of the invention will, no doubt, be suggested to those skilled in the art after having read the preceding disclosure. Accordingly, it is intended that the following claims be interpreted as encompassing all alterations, modifications, or alternative applications as fall within the true spirit and scope of the invention.

What is claimed is:

1. A digital logic simulation/emulation system comprising:
   a computer program digital-logic simulation process executed by a digital computer for modeling a hardware system that includes digital logic; and
   a hardware pod that:
      is adapted for being coupled to a digital logic circuit;
      includes a plurality of stimulus/response cells for providing stimulus signals to the digital logic circuit during a stimulation-response cycle, and for receiving responses from the digital logic circuit during the stimulation-response cycle; and
      further includes a communication port for receiving stimulation-control data from said digital-logic simulation process to be transmitted to the stimulus/response cells for controlling stimulation of the digital logic circuit during the stimulation-response cycle, and for receiving response data generated by the digital logic circuit in response to stimulation thereof during the stimulation-response cycle for transmission from said hardware pod to said digital-logic simulation process;
   said digital-logic simulation process and said hardware pod being coupled together in the simulation/emulation system for exchanging stimulation-control data and response data:

said digital-logic simulation process and said hardware pod being operable in an engaged operating mode in which said digital-logic simulation process first transmits stimulation-control data to said hardware pod for controlling stimulation of the digital logic circuit by the stimulus/response cells during a single stimulation-response cycle, and then receives from said hardware pod response data that reports the response of the digital logic circuit to stimulation during that stimulation-response cycle; and said digital-logic simulation process and said hardware pod also being operable in a disengaged operating mode which commences in response to a disengagement event occurring in said hardware pod while said hardware pod and said digital-logic simulation process are operating in the engaged operating mode, upon occurrence of the disengagement event said hardware pod transmitting a disengagement message to said digital-logic simulation process indicating to said digital-logic simulation process that said hardware pod is entering the disengaged operating mode and is commencing execution of stimulation-response cycles without receiving additional stimulation-control data from said digital-logic simulation process, and said digital-logic simulation process upon receiving the disengagement message from the hardware pod commencing operation in the disengaged operating mode in which said digital-logic simulation process continues execution without receiving response data from said hardware pod; and while said hardware pod and said digital-logic simulation process operate in the disengaged operating mode:

said hardware pod:
when an engagement event occurs within the hardware pod that requires communication with said digital-logic simulation process, both transmits an engagement message to said digital-logic simulation process, and enters the engaged operating mode; and
enters the engaged operating mode upon receiving an engagement message from said digital-logic simulation process; and said digital-logic simulation process:
when an engagement event occurs within the digital-logic simulation process that requires communication with said hardware pod, both transmits an engagement message to said hardware pod, and enters the engaged operating mode; and
enters the engaged operating mode upon receiving an engagement message from said hardware pod.

2. The simulation/emulation system of claim 1 wherein the engagement event occurring in said hardware pod is a requirement that said hardware pod transmit response data to said digital-logic simulation process.

3. The simulation/emulation system of claim 2 wherein said hardware pod detects occurrence of the engagement event occurring in the hardware pod within a single stimulation-response cycle of the digital logic circuit.

4. The simulation/emulation system of claim 1 wherein the engagement message sent from said hardware pod to said digital-logic simulation process is response data.

5. The simulation/emulation system of claim 1 wherein said hardware pod detects occurrence of the engagement event occurring in the hardware pod within a single stimulation-response cycle of the digital logic circuit.

6. The simulation/emulation system of claim 1 wherein the engagement event occurring in said digital-logic simulation process is a requirement that said digital-logic simulation process first transmit stimulation-control data to said hardware pod, and then wait for receipt from said hardware pod of response data generated by the digital logic circuit in response to stimulation by that stimulation-control data.

7. The simulation/emulation system of claim 1 wherein the engagement message sent from said digital-logic simulation process to said hardware pod is stimulation-control data.

8. A digital logic simulation/emulation system comprising:

a computer program digital-logic simulation process executed by a digital computer for modeling a hardware system that includes digital logic; and a hardware pod that:
is adapted for being coupled to a digital logic circuit;
includes a plurality of stimulus/response cells for providing stimulus signals to the digital logic circuit during a stimulation-response cycle, and for receiving responses from the digital logic circuit during the stimulation-response cycle; and
further includes a communication port for receiving stimulation-control data from said digital-logic simulation process to be transmitted to the stimulus/response cells for controlling stimulation of the digital logic circuit during the stimulation-response cycle, and for receiving response data generated by the digital logic circuit in response to stimulation thereof during the stimulation-response cycle for transmission from said hardware pod to said digital-logic simulation process;

said digital-logic simulation process and said hardware pod being coupled together in the simulation/emulation system for exchanging stimulation-control data and response data:

said digital-logic simulation process and said hardware pod being operable in an engaged operating mode in which said digital-logic simulation process first transmits stimulation-control data to said hardware pod for controlling stimulation of the digital logic circuit by the stimulus/response cells during a single stimulation-response cycle, and then receives from said hardware pod response data that reports the response of the digital logic circuit to stimulation during that stimulation-response cycle; and said digital-logic simulation process and said hardware pod also being operable in a disengaged operating mode which commences in response to a disengagement event occurring in said hardware pod while said hardware pod and said digital-logic simulation process are operating in the engaged operating mode, upon occurrence of the disengagement event said hardware pod transmitting a disengagement message to said digital-logic simulation process indicating to said digital-logic simulation process that said hardware pod is entering the disengaged operating mode and is commencing execution of stimulation-response cycles without receiving additional stimulation-control data from said digital-logic simulation process, and said digital-logic simulation process upon receiving the disengagement message from the hardware pod commencing operation in the disengaged operating mode in which said digital-logic simulation process continues execution without receiving response data from said hardware pod; and while said hardware pod and said digital-logic simulation process operate in the disengaged operating mode, said hardware pod, when an engagement event occurs within the hardware pod that requires communication with said digital-logic simulation process, transmits an engagement message to said digital-logic simulation process, and enters the engaged operating mode.

9. A digital logic simulation/emulation system comprising:

a computer program digital-logic simulation process executed by a digital computer for modeling a hardware system that includes digital logic; and a hardware pod that:
is adapted for being coupled to a digital logic circuit;
includes a plurality of stimulus/response cells for providing stimulus signals to the digital logic circuit during a stimulation-response cycle, and for receiving responses from the digital logic circuit during the stimulation-response cycle; and
further includes a communication port for receiving stimulation-control data from said digital-logic simulation process to be transmitted to the stimulus/response cells for controlling stimulation of the digital logic circuit during the stimulation-response cycle, and for receiving response data generated by the digital logic circuit in response to stimulation thereof during the stimulation-response cycle for transmission from said hardware pod to said digital-logic simulation process;

said digital-logic simulation process and said hardware pod being coupled together in the simulation/emulation system for exchanging stimulation-control data and response data:

said digital-logic simulation process and said hardware pod being operable in an engaged operating mode in which said digital-logic simulation process first transmits stimulation-control data to said hardware pod for controlling stimulation of the digital logic circuit by the stimulus/response cells during a single stimulation-response cycle, and then receives from said hardware pod response data that reports the response of the digital logic circuit to stimulation during that stimulation-response cycle; and said digital-logic simulation process and said hardware pod also being operable in a disengaged operating mode which commences in response to a disengagement event occurring in said hardware pod while said hardware pod and said digital-logic simulation process are operating in the engaged operating mode, upon occurrence of the disengagement event said hardware pod transmitting a disengagement message to said digital-logic simulation process indicating to said digital-logic simulation process that said hardware pod is entering the disengaged operating mode and is commencing execution of stimulation-response cycles without receiving additional stimulation-control data from said digital-logic simulation process, and said digital-logic simulation process upon receiving the disengagement message from the hardware pod commencing operation in the disengaged operating mode in which said digital-logic simulation process continues execution without receiving response data from said hardware pod; and while said hardware pod and said digital-logic simulation process operate in the disengaged operating mode, said digital-logic simulation process, when an engagement event occurs within the digital-logic simulation process that requires communication with said hardware pod, transmits an engagement message to said hardware pod, and enters the engaged operating mode.

* * * * *